US010224936B1

(12) United States Patent
Lin

(10) Patent No.: US 10,224,936 B1
(45) Date of Patent: Mar. 5, 2019

(54) SELF-CALIBRATING FREQUENCY QUADRUPLER CIRCUIT AND METHOD THEREOF

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 15/883,182

(22) Filed: Jan. 30, 2018

(51) Int. Cl.
*H03L 7/00* (2006.01)
*H03L 7/08* (2006.01)

(52) U.S. Cl.
CPC ...................... *H03L 7/08* (2013.01)

(58) Field of Classification Search
CPC ........................................... H02L 7/08
USPC ................................. 327/142–160
See application file for complete search history.

(56) References Cited

U.S. PATENT DOCUMENTS

| 5,815,017 A * | 9/1998 | McFarland | H04L 7/0337 327/158 |
| 6,977,605 B2 * | 12/2005 | Lee | H03L 7/0805 327/149 |
| 7,605,625 B2 * | 10/2009 | Pellerano | H03L 7/0812 327/158 |

* cited by examiner

*Primary Examiner* — Dinh T Le
(74) *Attorney, Agent, or Firm* — McClure, Qualey & Rodack, LLP

(57) ABSTRACT

An apparatus comprises: a main frequency quadrupler configured to receive a first clock and output a second clock of a quadruple frequency in accordance with a first control signal and a second control signal, wherein a timing difference between a first rising edge and a second rising edge of the second clock is controlled by the second control signal, and a timing difference between the first rising edge and a third rising edge of the second clock is controlled by the first control signal; an auxiliary frequency quadrupler configured to receive the first clock and output a third clock of the quadruple frequency with a timing offset controlled a third control signal; and a calibration circuit configured to generate and output the first control signal, the second control signal, and the third control signal in accordance with a timing difference between the second clock and the third clock.

10 Claims, 7 Drawing Sheets

SELF-CALIBRATING FREQUENCY QUADRUPLER CIRCUIT AND METHOD THEREOF

BACKGROUND OF THE DISCLOSURE

Field of the Disclosure

The present disclosure generally relates to frequency quadrupling, and more particularly to circuits and methods for frequency quadrupling.

Description of Related Art

As used throughout this disclosure, a clock is a signal that cyclically transitions back and forth between a high level and a low level; a rising edge of a clock takes place upon a low-to-high transition (of the clock); a falling edge of a clock takes place upon a high-to-low transition (of the clock); a cycle of a clock starts upon a rising edge and ends upon a next rising edge (where a next cycle starts) and contains a falling edge that occurs in time between the rising edge and the next rising edge; a pulse width of a cycle of a clock is a timing difference between a starting rising edge and a falling edge of said cycle; and a period of a cycle of a clock is a timing difference between a starting rising edge of said cycle and a next rising edge.

A frequency quadrupler receives an input clock of an input frequency and outputs an output clock of an output frequency that is four times greater than the input frequency. A frequency quadrupler can be embodied by a PLL (phase lock loop). A functional block diagram of a PLL 150 that can be used to embody a conventional frequency quadrupler is depicted in FIG. 1. PLL 150 comprises: a PFD (phase/frequency detector) 151 configured to receive a first clock $S_A$ and a second clock $S_B$ and output a phase error signal $S_E$; a LF (loop filter) 152 configured to receive the phase error signal $S_E$ and output a control voltage $V_{CTL}$; a VCO (voltage controlled oscillator) 153 configured to receive the control voltage $V_{CTL}$ and output a third clock $S_C$; and a divide-by-4 circuit 154 configured to receive the third clock $S_C$ and output the second clock $S_B$. For each cycle of the first clock $S_A$, four cycles of the third clock $S_C$ are generated, wherein a timing difference between said cycle of the first clock $S_A$ and a first cycle of said four cycles for the third clock $S_C$ is detected by PFD 151 then filtered by LF 152 to establish the control voltage $V_{CTL}$ in a closed loop manner. Thus, a frequency of the third clock $S_C$ is established in a closed loop manner to be equal to a quadruple frequency (of a frequency of the first clock $S_A$).

PLL 150 is well understood to those of ordinary skill in the art and thus not explained in detail here. An issue with PLL 150 is: an instantaneous timing of the third clock $S_C$ might deviate appreciably from an ideal timing, although a mean frequency of the third clock $S_C$ is accurately established to be the quadruple frequency. The amount that an instantaneous timing of a clock deviates from an ideal timing is often referred to as a "jitter." For the third clock $S_C$ to have a small jitter, VCO 153 needs to have a low noise. In practice, a low noise VCO is power intensive, or costly, or both.

What is desired is a frequency quadrupler that can output a low-jitter clock without using a power hungry or costly VCO.

BRIEF SUMMARY OF THIS DISCLOSURE

In an embodiment, an apparatus comprises: a main frequency quadrupler configured to receive a first clock and output a second clock of a quadruple frequency in accordance with a first control signal and a second control signal, wherein a timing difference between a first rising edge and a second rising edge of the second clock is controlled by the second control signal, and a timing difference between the first rising edge and a third rising edge of the second clock is controlled by the first control signal; an auxiliary frequency quadrupler configured to receive the first clock and output a third clock of the quadruple frequency, wherein a static timing offset between the second clock and the third clock is controlled by a third control signal; and a calibration circuit configured to generate and output the first control signal, the second control signal, and the third control signal in accordance with a timing difference between the second clock and the third clock. In an embodiment, the main frequency quadrupler adopts a rising edge of the first clock into the first rising edge of the second clock with a fixed delay, adopts the first rising edge of the second clock into the second rising edge of the second clock with a delay controlled by the second control signal, adopts a falling edge of the first clock into the third rising edge of the second clock with a delay controlled by the first control signal, and adopts the third rising edge of the second clock into a fourth rising edge of the second clock with a delay controlled by the second control signal. In an embodiment, the auxiliary frequency quadrupler comprises a phase lock loop.

In an embodiment, an apparatus comprises: a main frequency quadrupler configured to receive a first clock of a fundamental frequency and output a second clock of a quadruple frequency in accordance with a first control signal and a second control signal, wherein a first rising edge of the second clock is adopted from a rising edge of the first clock, a second rising edge of the second clock is adopted from the first rising edge of the second clock with a delay controlled by the second control signal, a third rising edge of the second clock is adopted from a falling edge of the first clock with a delay controlled by the first control signal, and a fourth rising edge of the second clock is adopted from the third rising edge of the second clock with a delay controlled by the second control signal; an auxiliary frequency quadrupler configured to receive the first clock and output a third clock of a quadruple frequency based on a phase lock loop, wherein a static timing offset between the third clock and the second clock is controlled by a third control signal; and a calibration circuit configured to output the first control signal, the second control signal, and the third control signal in accordance with a timing difference between the third clock and the second clock. In an embodiment, the calibration circuit adjusts the third control signal in accordance with a timing difference between the first rising edge of the second clock and a first rising edge of the third clock following the rising edge of the first clock. In an embodiment, the calibration circuit adjusts the second control signal in accordance with a timing difference between the second rising edge of the second clock and a second rising edge of the third clock. In an embodiment, the calibration circuit adjusts the first control signal in accordance with a timing difference between the third rising edge of the second clock and a third rising edge of the third clock. In an embodiment, the main frequency quadrupler comprises: a two-phase clock generator configured to receive the first clock and output a two-phase fourth clock in accordance with the first control signal, wherein a timing difference between a first phase and a second phase of the two-phase fourth clock is controlled by the first control signal; a two-phase frequency doubler configured to receive the two-phase fourth clock and output a fifth clock in accordance with the second control signal, wherein a pulse width of the fifth clock is controlled by the second control signal; and a single-phase frequency doubler configured to receive the fifth clock and output the second clock. In an embodiment, the auxiliary frequency quadrupler comprises a phase lock loop configured to receive the first clock and output a sixth clock, and a variable delay circuit configured to receive the sixth clock and output the third clock in accordance with the third control signal.

In an embodiment, a method comprises: receiving a first clock of a fundamental frequency; generating a first control signal, and second control signal, and a third control signal, establishing a first rising edge of a second clock of a quadruple frequency based on an adoption of a rising edge of the first; establishing a second rising edge of the second clock based on an adoption of the first rising edge of the second clock with a delay of an amount controlled by the second control signal; establishing a third rising edge of the second clock based on an adoption of an inversion of a falling edge of the first clock with a delay of an amount controlled by the first control signal; establishing a fourth rising edge of the second clock based on an adoption of the third rising edge of the second clock with a delay of an amount controlled by the second control signal; generating a third clock of the quadruple frequency using a phase lock loop, wherein a static timing offset between the third clock and the second clock is controlled by the third control signal; adjusting the third control signal in accordance with a timing difference between a first rising edge of the third clock and the first rising edge of the second clock; adjusting the second control signal in accordance with a timing difference between a second rising edge of the third clock and the second rising edge of the second clock; and adjusting the first control signal in accordance with a timing difference between a third rising edge of the third clock and the third rising edge of the second clock.

DETAILED DESCRIPTION OF THIS DISCLOSURE

The present disclosure is directed to frequency quadrupler and method of frequency quadrupling. While the specification describes several example embodiments of the disclosure considered favorable modes of practicing the disclosure, it should be understood that the disclosure can be implemented in many ways and is not limited to the particular examples described below or to the particular manner in which any features of such examples are implemented. In other instances, well-known details are not shown or described to avoid obscuring aspects of the disclosure.

Persons of ordinary skill in the art understand terms and basic concepts related to microelectronics that are used in this disclosure, such as "CMOS (complementary metal oxide semiconductor)," "PMOS (P-channel metal oxide semiconductor) transistor," "NMOS (N-channel metal oxide semiconductor) transistor," "clock," "phase," "signal," "frequency," "period," "data flip flop," "inverter," and "phase lock loop." Terms and basic concepts like these are well known and understood to those of ordinary skill in the art and thus will not be explained in detail here. Those of ordinary skill in the art will also recognize circuit symbols, such as symbols of PMOS transistor and NMOS transistor, and understand what nodes comprise the "source," the "gate," and the "drain" terminals thereof. Therefore, symbols like these are not defined or described herein.

This disclosure is presented in a vernacular understood by persons skilled in the art. For instance, "A is equal to B" means "a difference between A and B is smaller than an engineering tolerance"; "A aligns with B in timing" means "a timing difference between A and B is smaller than an engineering tolerance." That is, phrases like "A is equal to B" is in terms of a practical/engineering sense, as opposed a theoretical mathematical sense.

Throughout this disclosure, a bus notation widely used in prior art is used. For instance, A[3:0] denotes a bus of width four and includes four constituent signals A[0], A[1], A[2], and A[3].

Figure 1:
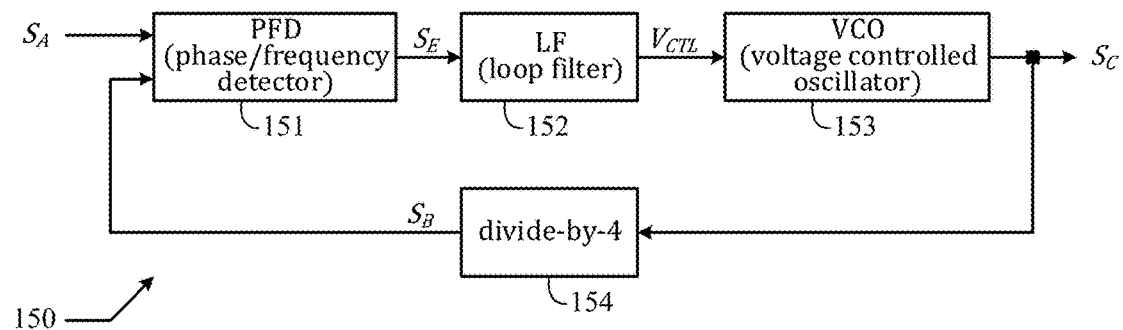
FIG. 1 shows a schematic diagram of a prior art frequency quadrupler.
Figure 2:
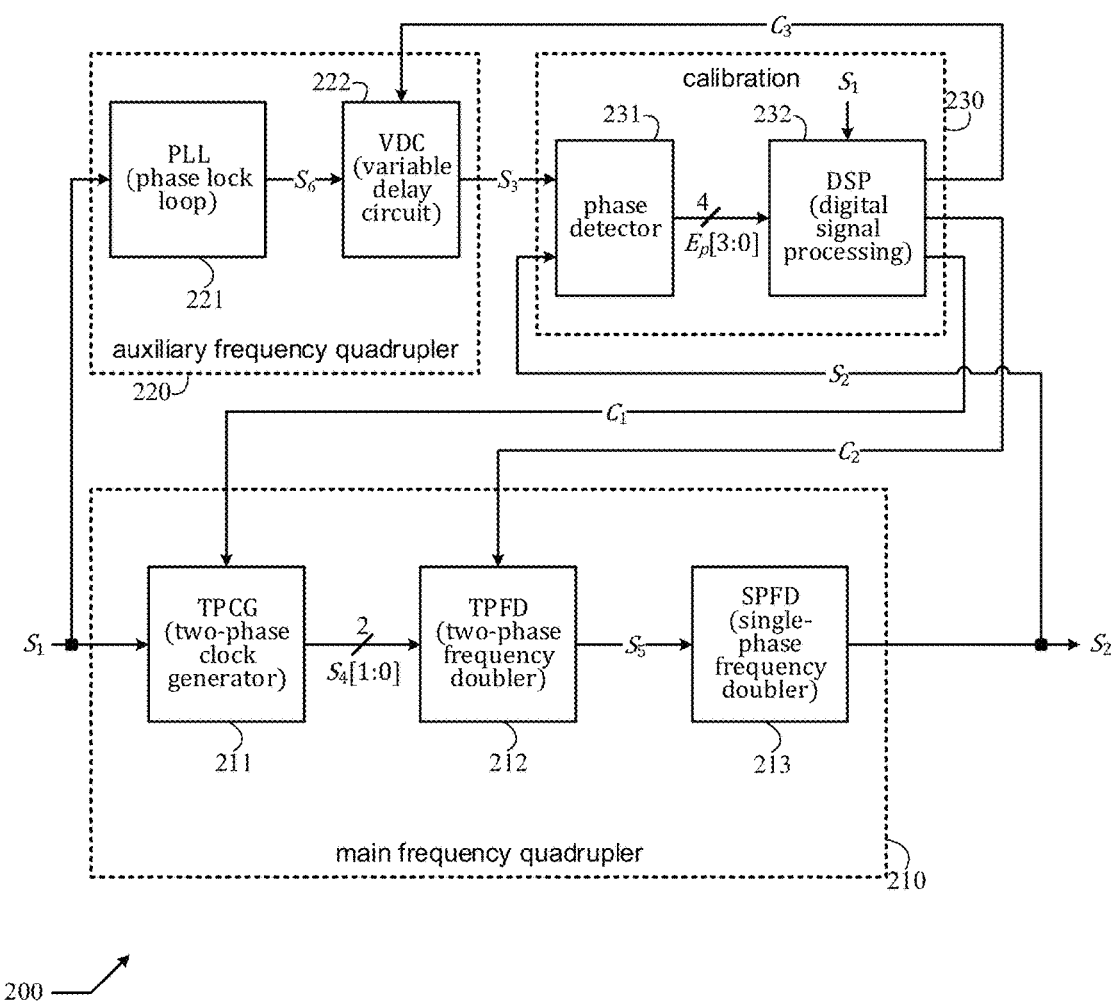
FIG. 2 shows a functional block diagram of a frequency quadrupler in accordance with an embodiment of the present disclosure.

A functional block diagram of a self-calibrating frequency quadrupler 200 in accordance with an embodiment of the present disclosure is depicted in FIG. 2. Self-calibrating frequency quadrupler 200 comprises: a main frequency quadrupler 210 configured to receive a first clock $S_1$ and output a second clock $S_2$ in accordance with a first control signal $C_1$ and a second control signal $C_2$, wherein $C_1$ and $C_2$ controls a uniformity of $S_2$; an auxiliary frequency quadrupler 220 configured to receive the first clock $S_1$ and output a third clock $S_3$ in accordance with a third control signal $C_3$, wherein $C_3$ controls a timing offset of $S_3$; and a calibration circuit 230 configured to receive the second clock $S_2$ and the third clock $S_3$ and output the first control signal $C_1$, the second control signal $C_2$, and the third control signal $C_3$. Here, $S_1$ is an input clock, $S_2$ is an output clock that has a statistically precise but not necessarily uniform timing, and $S_3$ is an auxiliary clock that has a statistically uniform but not necessarily precise timing. For every rising edge of $S_1$, four rising edges, including a first, a second, a third, and a fourth rising edge, of $S_2$ are generated; in the meanwhile, four rising edges, including a first, a second, a third, and a fourth rising edge, of $S_3$ are generated. Among said four rising edges of $S_2$: the first rising edge is adopted from a rising edge of $S_1$ with a fixed delay; the second rising edge is adopted from the first rising edge with a variable delay controlled by $C_2$; the third rising edge is adopted from a falling edge of $S_1$ with a variable delay controlled by $C_1$; and the fourth rising edge is adopted from the third rising edge with the variable delay controlled by $C_2$. The calibration circuit 230 detects an average timing difference between said four rising edges of $S_2$ and said rising edges of $S_3$. Due to averaging, the likely imprecise nature of $S_3$ is obscured, while the likely nonuniform nature of $S_2$ is exposed. Based on the average timing difference, a static timing offset between $S_2$ and $S_3$ is detected and corrected by properly adjusting $C_3$, while the nonuniformity of $S_2$ is detected and corrected by properly adjusting $C_1$ and $C_2$.

The main frequency quadrupler 210 comprises: a TPCG (two-phase clock generator) 211 configured to receive $S_1$ and output a two-phase, fourth clock $S_4$ [1:0] in accordance with $C_1$; a TPFD (two-phase frequency doubler) 212 configured to receive $S_4$ [1:0] and output a fifth clock $S_5$ in accordance with $C_2$; and a SPFD (single-phase frequency doubler) 213 configured to receive $S_5$ and output $S_2$. For each cycle of $S_1$, TPCG 211 generates one associated cycle of $S_4$[0] and one associated cycle of $S_4$[1]. For each rising edge of $S_1$, TPCG 211 generates an associated rising edge of $S_4$[0] after a delay of a first amount $t_{d1}$. For each falling edge of $S_1$, TPCG 211 generates an associated rising edge of $S_4$ [1] after a delay of a second amount $t_{d2}$. A difference between $t_{d2}$ and $t_{d1}$ is a property of TPCG 211 that is controlled by $C_1$. For each cycle of $S_4$[0] and the associated cycle of $S_4$[1], TPFD 212 generates two cycles of $S_5$, including a first and a second cycle, wherein the first cycle starts upon a rising edge adopted from a rising edge of said cycle of $S_4$[0] and follows with a falling edge after a delay of a third amount $t_{d3}$, while the second cycle starts upon a rising edge adopted from a rising edge of said cycle of $S_4$ [1] and follows with a falling edge after a delay of the third amount $t_{d3}$. Here, the third amount $t_{d3}$ is a property of TPFD 212 that is controlled by $C_2$. For each cycle of $S_5$, SPFD 213 generates two cycles of $S_2$, including a first and a second cycle, wherein the first cycle starts upon a rising edge adopted from a rising edge of said cycle of $S_5$, while the second cycle starts upon a rising edge adopted from a falling edge of said cycle of $S_5$.

Figure 3:
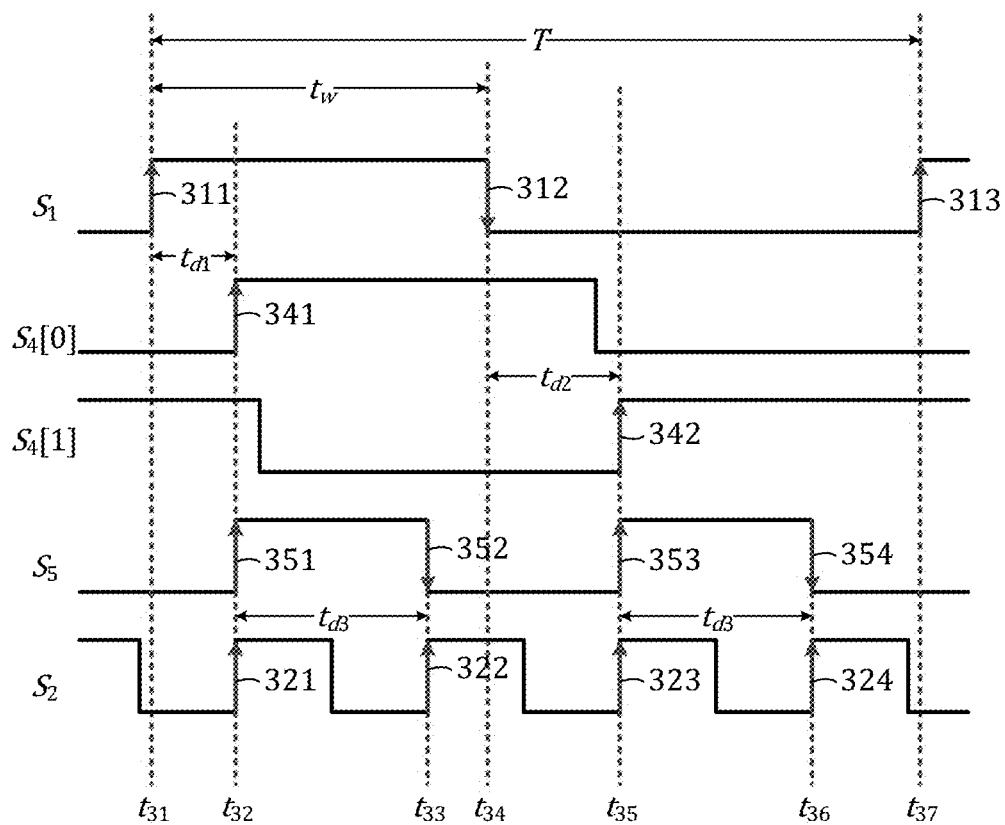
FIG. 3 shows an illustrative timing diagram for the frequency quadrupler of FIG. 2.

An illustrative timing diagram is depicted in FIG. 3. As shown, a cycle of $S_1$ starts upon rising edge 311 at $t_{31}$ and ends upon rising edge 313 at $t_{37}$, where $t_{37}-t_{31}=T$ is a period of the cycle, and in between contains falling edge 312 at $t_{34}$, where $t_{34}-t_{31}=t_w$ is a pulse width of the cycle. Rising edge 341 of $S_4$[0] at $t_{32}$ is adopted from rising edge 311 of $S_1$ with a delay of $t_{d1}$, wherein $t_{d1}=t_{32}-t_{31}$ is the first amount. Rising edge 342 of $S_4$ [1] at $t_{35}$ is adopted from falling edge 312 of $S_1$ with a delay of $t_{d2}$, wherein $t_{d2}=t_{35}-t_{34}$ is the second amount. Rising edge 351 (353) of $S_5$ at $t_{32}$ ($t_{35}$) is adopted from rising edge 341 (342) of $S_4$ [0] ($S_4$[1]) and followed by falling edge 352 (354) at $t_{33}$ ($t_{36}$) after a delay of $t_{d3}$, wherein $t_{d3}=t_{33}-t_{32}$ ($t_{d3}=t_{36}-t_{35}$) is the third amount.

Figure 4:
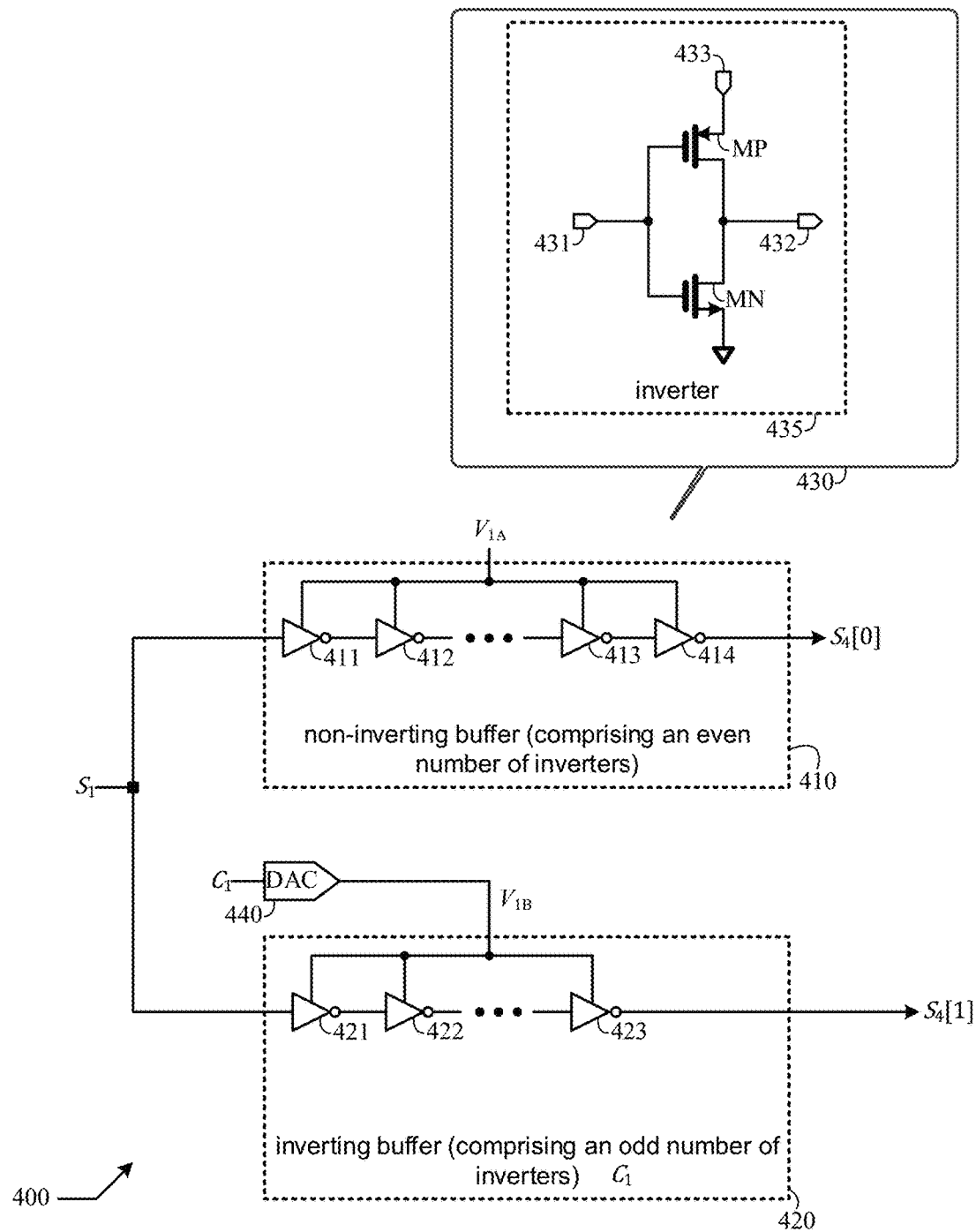
FIG. 4 shows a schematic diagram of an embodiment of a two-phase clock generator.

A schematic diagram of a TPCG (two-phase clock generator) 400 suitable for embodying TPCG 211 of FIG. 2 is shown in FIG. 4. TPCG 400 includes: a non-inverting buffer 410 powered by a fixed supply voltage $V_{1A}$ and configured to receive $S_1$ and output $S_4$ [0], an inverting buffer 420 powered by a variable supply voltage $V_{1B}$ and configured to receive $S_1$ and output $S_4$ [1], and a DAC (digital-to-analog converter) 440 configured to receive $C_1$ and output the variable supply voltage $V_{1B}$. A rising edge of $S_1$ will traverse through the non-inverting buffer 410, resulting in a rising edge of $S_4$[0] after a delay of $t_{d1}$ that is controlled by $V_{1A}$. A falling edge of $S_1$ will traverse through and inverted by the inverting buffer 420, resulting in a rising edge of $S_4$ [1] after a delay of $t_{d2}$ that is controlled by $V_{1B}$. The non-inverting buffer 410 comprises an even number of inverters (i.e. 411, 412, . . . , 413, 414) configured in a cascade topology, wherein said even number of inverters are powered by the fixed supply voltage $V_{1A}$. On the other hand, the inverting buffer 420 comprises an odd number of inverters (i.e. 421, 422, . . . , 423) configured in a cascade topology, wherein said odd number of inverters are powered by the variable supply voltage $V_{1B}$ that is determined by $C_1$. As such, the amount of delay of the non-inverting buffer 401 (i.e. $t_{d1}$) is fixed, while the amount of delay of the inverting buffer 401 (i.e. $t_{d2}$) is variable and controlled by $C_1$, and thus a timing difference between said rising edge of $S_4$[0] and said rising edge of $S_4$[1] is controlled by $C_1$. A schematic diagram of an inverter 435 that can be instantiated to embody inverters (411~414, 421~423) is shown inside a call box 430. Inverter 435 comprises a PMOS (p-channel metal oxide semiconductor) transistor MP and a NMOS (n-channel metal oxide semiconductor) transistor MN configured to receive an input voltage from a preceding circuit via an input pin 431 shown on the left side, output an output voltage to a succeeding circuit via an output pin 432 shown on the right side. Inverter 435 is further configured to receive a supply voltage (either $V_{1A}$ or $V_{1B}$) via a power pin 433 shown on the top side. Inverter 435 is well known to those of ordinary skill in the art and thus not described in detail here. That a delay of an inverter such as inverter 435 can be controlled by varying the supply voltage (to be specific, a higher supply voltage leads to a shorter delay) is well known to those of ordinary skill in the art and thus not described in detail here. DAC is also well known to those of ordinary skill in the art and thus not described in detail here.

Figure 5:
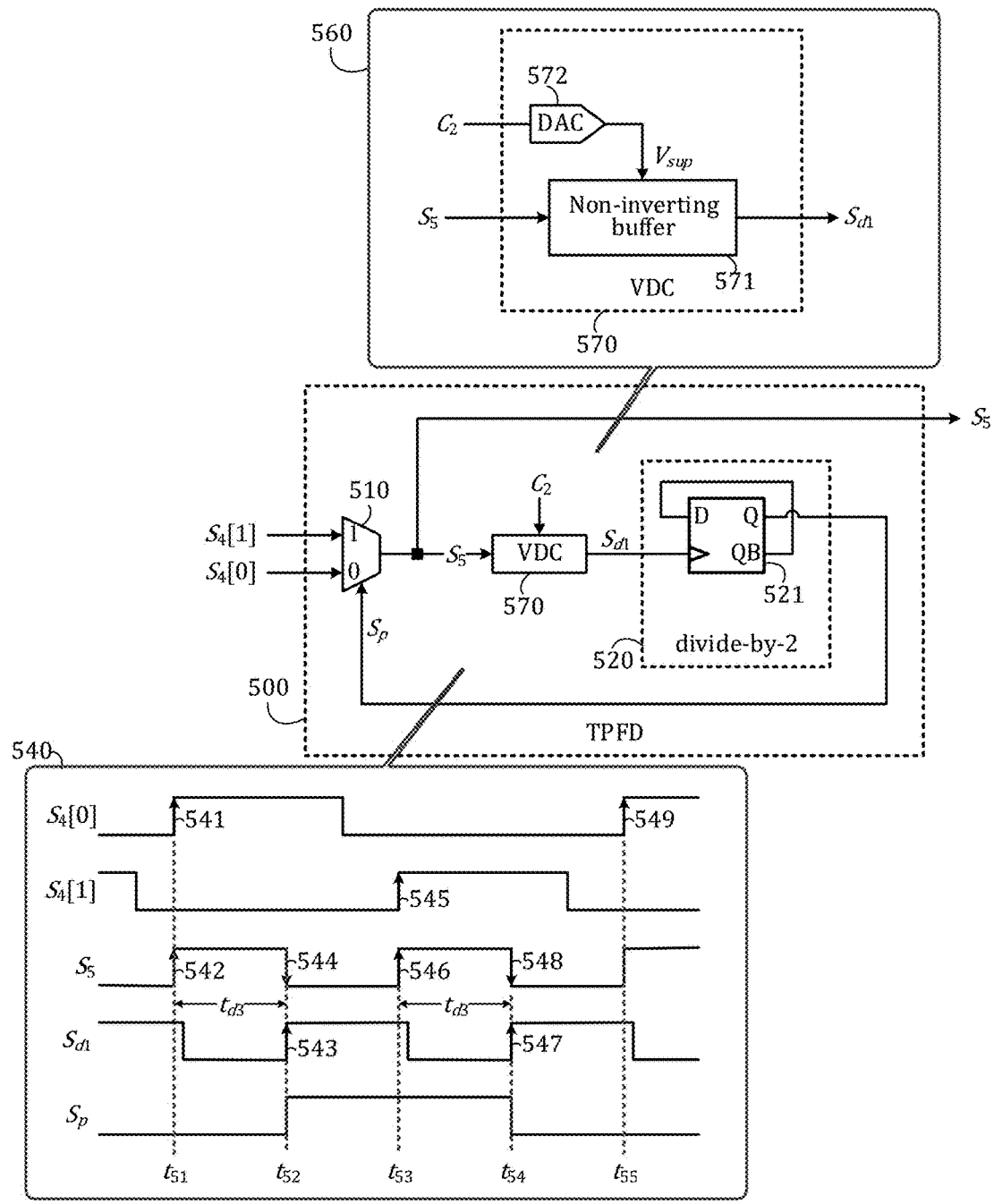
FIG. 5 shows a schematic diagram of an embodiment of a two-phase frequency doubler, along with an illustrative timing diagram.

A schematic diagram of a TPFD 500 suitable for embodying TPFD 212 of FIG. 2 is depicted in FIG. 5. TPFD 500 comprises: a multiplexer 510 configured to output $S_5$ by selecting one of $S_4$[0] and $S_4$[1] in accordance with a phase selection signal $S_p$; a VDC (variable delay circuit) 570 configured to receive $S_5$ and output a delayed clock $S_{d1}$ in accordance with a control by $C_2$; and a divide-by-2 circuit 520 configured to receive the delayed clock $S_{d1}$ and output the phase selection signal $S_p$. As shown inside the callout box 560, VDC 570 comprises a non-inverting buffer 571 configured to receive $S_5$ and output $S_{d1}$ in accordance with a variable supply voltage $V_{sup}$, and a DAC (digital-to-analog converter) 572 configured to receive $C_2$ and output the variable supply voltage $V_{sup}$.

In an embodiment, non-inverting buffer 571 comprises an even number of inverters configured in a cascade topology (see the non-inverting buffer 410 of FIG. 4) and powered by the variable supply voltage $V_{sup}$. When a rising edge of $S_5$ traverses the non-inverting buffer 571, it turns into a rising edge of $S_{d1}$ after a delay of $t_{d3}$ that can be controlled by $V_{sup}$, and thus controlled by $C_2$. Divide-by-2 circuit 520 comprises a DFF (data flip flop) 521 configured in a negative feedback topology. DFF 521 has an input pin labeled as "D," an output pin labeled as "Q," an inverted output pin labeled as "QB," and a clock pin labeled by a wedge symbol; such notations are widely used in prior art and thus not described in detail here. DFF, and that a DFF configured in a negative feedback topology can be used to embody a divide-by-2 function are well known to those of ordinary skill in the art and thus not described in detail here.

An illustrative timing diagram of TPFD 500 is shown inside callbox 540. Initially $S_p$ is 0, and thus $S_5$ is selected from $S_4$[0], and rising edge 541 of $S_4$[0] at $t_{51}$ turns into rising edge 542 of $S_5$, which traverses VDC 570 and turns into rising edge 543 of $S_{d1}$ at $t_{52}$ after a delay of $t_{d3}$, triggering DFF 521 to toggle $S_p$ to 1. Once $S_p$ toggles to 1, $S_5$ is selected from $S_4$[1] and transitions into 0, resulting in falling edge 544. Then, $S_5$ stays low until the arrival of rising edge 545 of $S_4$ [1] (at $t_{53}$), which turns into rising edge 546 of $S_5$, which traverses VDC 570 and turns into rising edge 547 of $S_{d1}$ (at $t_{54}$) after a delay of $t_{d3}$, triggering DFF 521 to toggle $S_p$ to 0. Once $S_p$ toggles to 0, $S_5$ is selected from $S_4$[0] and transitions into 0, resulting in falling edge 548. This completes a full cycle of frequency doubling, followed by a next full cycle starting upon a next rising edge 549 of $S_4[0]$ at $t_{55}$.

Figure 6:
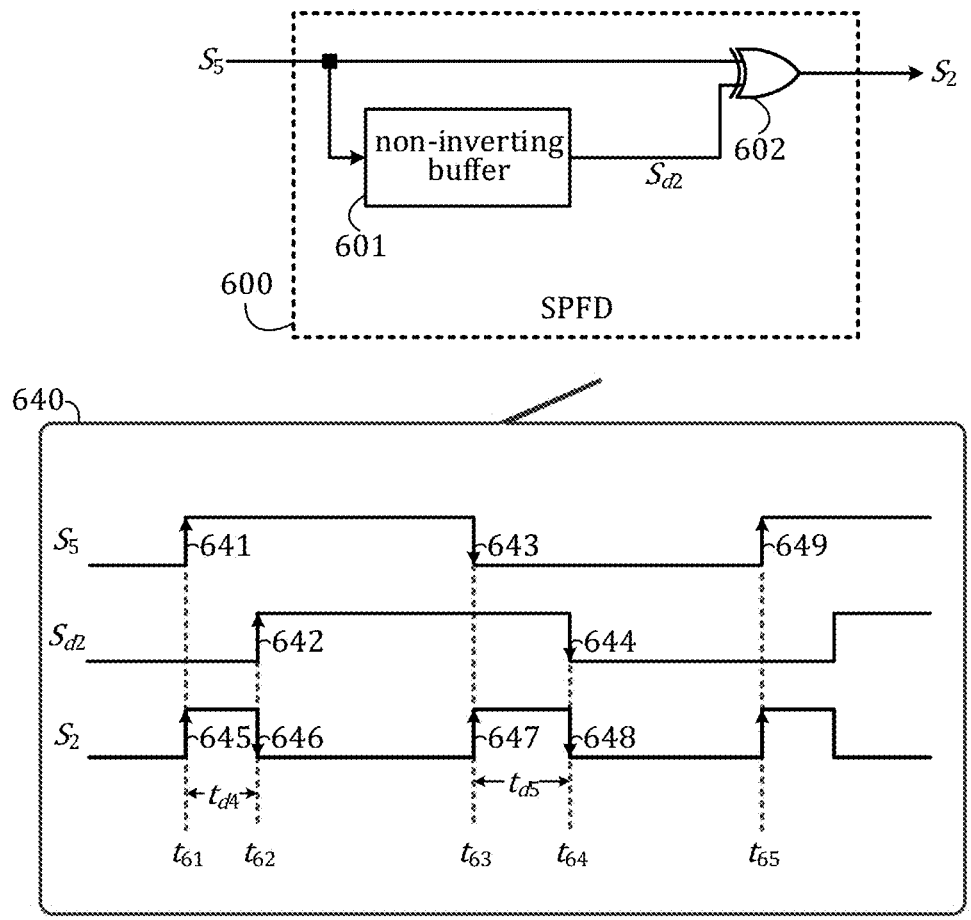
FIG. 6 shows a schematic diagram of an embodiment of a single-phase frequency doubler, along with an illustrative timing diagram.

A schematic diagram of a SPFD (single-phase frequency doubler) 600 suitable for embodying SPFD 213 of FIG. 2 is shown in FIG. 6. SPFD 600 comprises: a non-inverting buffer 601 configured to receive $S_5$ and output a delayed clock $S_{d2}$, and an XOR (exclusive or) gate 602 configured to receive $S_5$ and $S_{d2}$ and output $S_2$. Non-inverting buffer 601 can be embodied using a circuit like non-inverting buffer 410 of FIG. 4. An illustrative timing diagram is shown inside callout box 640. A cycle of frequency doubling starts with a rising edge 641 of $S_5$ (at $t_{61}$), which traverses non-inverting buffer 601 and turns into rising edge 642 of $S_{d2}$ (at $t_{62}$) after a delay of a fourth amount $t_{d4}$. Afterwards, a falling edge 643 of $S_5$ (at $t_{63}$) traverses non-inverting buffer 601 and turns into falling edge 644 of $S_{d2}$ (at $t_{64}$) after a delay of a fifth amount $t_{d5}$. Meanwhile, the XOR gate 602 turns rising (rising, falling, falling) edge 641 (642, 643, 644) of $S_5$ ($S_{d2}$, $S_5$, $S_{d2}$) into rising (falling, rising, falling) edge 645 (646, 647, 648) of $S_2$. This completes a full cycle of frequency doubling, followed by a next full cycle starting upon a next rising edge 649 of $S_5$ at $t_{65}$. Note that $t_{d5}$ is usually different from $t_{d4}$, since a rise time is usually different from a fall time for an inverter, which is a building block of non-inverting buffer 601.

Auxiliary frequency doubler 220 comprises a PLL 221 configured to receive $S_1$ and output a sixth clock $S_6$, and a VDC (variable delay circuit) 222 configured to receive the sixth clock $S_6$ and output $S_3$ in accordance with $C_3$. PLL 221 can be embodied by instantiating PLL 150 of FIG. 2. VDC 222 can be embodied by a circuit like VDC 570 of FIG. 5. $C_3$ controls a delay of VDC 222, and thus a timing offset of $S_3$.

Figure 7:
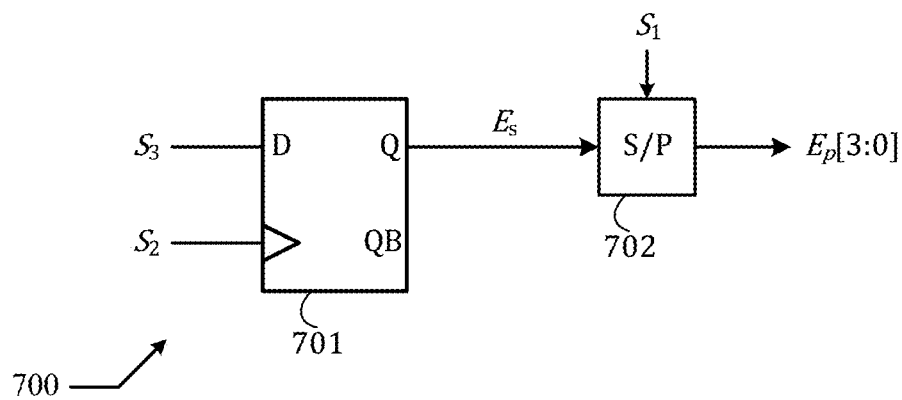
FIG. 7 shows a schematic diagram of an embodiment of a phase detector.

Calibration circuit 230 comprises a phase detector 231 configured to receive $S_2$ and $S_3$ and output a phase error signal $E_p[3:0]$, and a DSP (digital signal processing) unit 232 configured to receive $E_p[3:0]$ and output $C_1$, $C_2$, and $C_3$. In response to each rising edge of $S_1$, four rising edges of $S_2$, including a first, a second, a third, and a fourth, are generated by the main frequency quadrupler 210. Meanwhile, four rising edges of $S_3$, including a first, a second, a third, and a fourth, are generated by the auxiliary frequency quadrupler 220. Phase detector 231 is employed to detect a timing difference between said four rising edges of $S_2$ and said four rising edges of $S_3$. A schematic diagram of a phase detector 700 that can be used to embody phase detector 231 is shown in FIG. 7. Phase detector 700 comprises a DFF (data flip flop) 701 configured to output a single-bit decision $E_s$ based on using $S_2$ to sample $S_3$, and a S/P (serial-to-parallel conversion) circuit 702 configured to convert the single-bit decision $E_s$ into a 4-bit decision $E_s[3:0]$ in accordance with $S_1$. For each rising edge of $S_1$ four samples of $E_s$ are generated serially, wherein a first, second, third, and fourth sample of said four samples of $E_s$ represents a timing relation between the first, second, third, and fourth rising edge of $S_2$ and the first, second, third, and fourth rising edge of $S_3$, respectively. Said four samples of $E_s$ are then converted into one word of $E_p[3:0]$ by S/P circuit 702, wherein $E_p[0]$, $E_p[1]$, $E_p[2]$, and $E_p[3]$ is adopted form the first, second, third, and fourth sample of said four samples of $E_s$. If the first (second, third, fourth) rising edge of $S_3$ arrives ahead of the first (second, third, fourth) rising edge of $S_2$, $E_p[0]$ ($E_p[1]$, $E_p[2]$, $E_p[3]$) will be 1, otherwise it will be 0. DSP unit 232 adjusts $C_1$, $C_2$, and $C_3$ in accordance with $E_p[3:0]$ so that said four rising edges of $S_2$ can align with said four rising edges and $S_3$ in an average sense; when that happens, each sample of $E_p[0]$, $E_p[1]$, $E_p[2]$, and $E_p[3]$ will be a random binary number with a 50% chance of being 1 and a 50% chance of being 0. DSP unit 232 collects many (say one million, by way of example but not limitation) samples of $E_p[0]$. If it sees $E_p[0]$ has more samples of "1" ("0") than "0" ("1"), it suggests a timing of the first rising edge of $S_3$ is too early (late), relative to a timing of the first rising edge of $S_2$; in this case, DSP unit 232 will decrement (increment) a value of $C_3$, thus delay (advance) a timing of $S_3$ for all the four edges of $S_3$. In a steady state, the first rising edge of $S_3$ will align with the first rising edge of $S_2$ in an average sense. As such, a static timing offset of $S_3$ with respect to $S_2$ is calibrated. After that, DSP unit 232 collects many (say one million, by way of example but not limitation) samples of $E_p[2]$. If it sees $E_p[2]$ has more samples of "1" ("0") than "0" ("1"), it suggests a timing of the third rising edge of $S_2$ is too late (early); in this case, DSP unit 232 will increment (decrement) a value of $C_1$, thus decrement (increment) a value of $t_{d2}$ to advance (delay) a timing of the third rising edge of $S_2$. In a steady state where the third rising edge of $S_3$ aligns with the third rising edge of $S_2$ in an average sense, a mean timing difference between the first rising edge and the third rising edge of $S_2$ will be T/2, since a mean timing difference between the first edge and the third edge of $S_3$ is T/2, thanks to a phase locking function of PLL 221. As such, a timing of the third rising edge of $S_2$ is calibrated. Note that both the relative timing between the first rising edge and the second rising edge of $S_2$ and the relative timing between the third rising edge and the fourth rising edge of $S_2$ are $t_{d3}$ (see FIG. 3 and FIG. 5) and thus controlled by $C_2$. Therefore, once the static timing offset of $S_3$ and the timing of the third edge of $S_2$ are calibrated, either $E_p[1]$ and $E_p[3]$ can be used to adjust $C_2$.

In an embodiment, DSP unit 232 collects many (say one million, by way of example but not limitation) samples of $E_p[1]$. If it sees $E_p[1]$ has more samples of "1" ("0") than "0" ("1"), it suggests a timing of the second rising edge of $S_2$ is too late (early); in this case, DSP unit 232 will increment (decrement) a value of $C_2$, thus decrement (increment) a value of $t_{d3}$ to advance (delay) a timing of the second rising edge of $S_2$. In a steady state where the second rising edge of $S_3$ aligns with the second rising edge of $S_2$ in an average sense, a mean timing difference between the first rising edge and the second rising edge of $S_2$ will be T/4, since a mean timing difference between the first rising edge and the second rising edge of $S_3$ is T/4 due to the phase locking function of PLL 221. As such, a timing of the second rising edge of $S_2$ is calibrated. In addition, a timing of the fourth rising edge of $S_2$ is also calibrated. In another embodiment, $E_p[3]$, instead of $E_p[1]$, is used to adjust $C_2$. In yet another embodiment, a combination of both $E_p[1]$ and $E_p[3]$ is used to adjust $C_2$.

An advantage of self-calibration frequency quadrupler of FIG. 2 is: by using a main frequency quadrupler that has a high precision and an auxiliary frequency quadrupler that has a good uniformity, along with a calibration technique, one can establish a precise and uniform output clock without using a single frequency quadrupler of both high precision and good uniformity that will be more power hungry, or costly, or both power hungry and costly.

Figure 8:
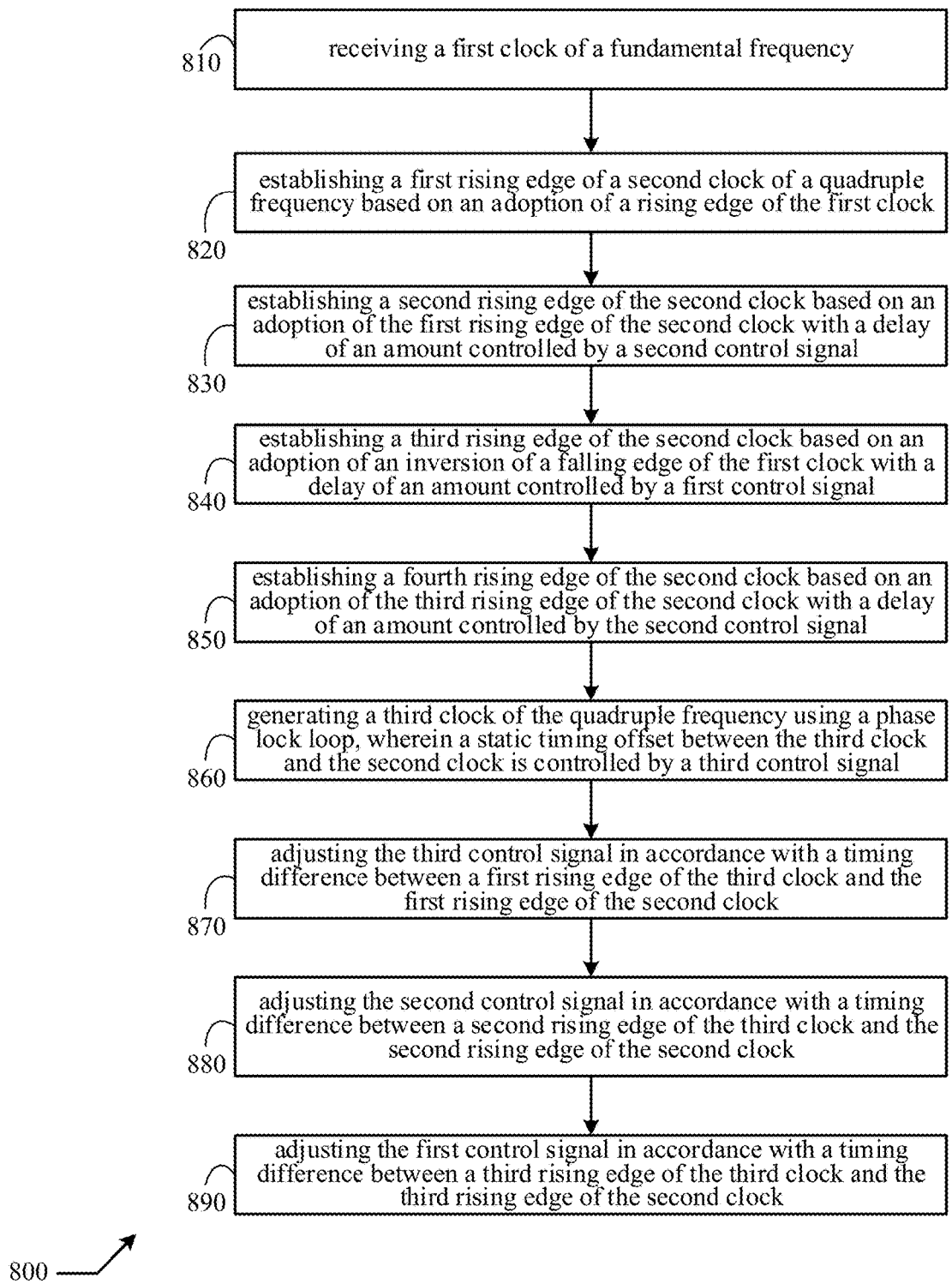
FIG. 8 shows a flow diagram of a method in accordance with in an embodiment of the present disclosure.

As shown in a flow diagram 800 depicted in FIG. 8, a method comprises: receiving a first clock of a fundamental frequency (step 810); establishing a first rising edge of a second clock of a quadruple frequency based on an adoption of a rising edge of the first clock (step 820); establishing a second rising edge of the second clock based on an adoption of the first rising edge of the second clock with a delay of an amount controlled by a second control signal (step 830); establishing a third rising edge of the second clock based on an adoption of an inversion of a falling edge of the first clock with a delay of an amount controlled by a first control signal (step 840); establishing a fourth rising edge of the second clock based on an adoption of the third rising edge of the second clock with a delay of an amount controlled by the second control signal (step 850); generating a third clock of the quadruple frequency using a phase lock loop, wherein a static timing offset between the third clock and the second clock is controlled by a third control signal (step 860); adjusting the third control signal in accordance with a timing difference between a first rising edge of the third clock and the first rising edge of the second clock (step 870); adjusting the second control signal in accordance with a timing difference between a second rising edge of the third clock and the second rising edge of the second clock (step 880); and adjusting the first control signal in accordance with a timing difference between a third rising edge of the third clock and the third rising edge of the second clock (step 890).

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An apparatus comprising:
a main frequency quadrupler configured to receive a first clock and output a second clock in accordance with a first control signal and a second control signal, wherein a timing difference between a first rising edge and a second rising edge of the second clock is controlled by the second control signal, and a timing difference between the first rising edge and a third rising edge of the second clock is controlled by the first control signal;
an auxiliary frequency quadrupler configured to receive the first clock and output a third clock of the quadruple frequency, wherein a static timing offset between the second clock and the third clock is controlled by a third control signal; and
a calibration circuit, coupled to the auxiliary frequency quadrupler via the third clock signal, is configured to generate and output the first control signal, the second control signal, and the third control signal in accordance with a timing difference between the second clock and the third clock.

2. The apparatus of claim 1, wherein the main frequency quadrupler sets a first rising edge of the second clock based on the rising edge of the first clock with a fixed delay, sets the second rising edge of the second clock based on the first rising edge of the second clock with a delay controlled by the second control signal, sets the third rising edge of the second clock based on a falling edge of the first clock with a delay controlled by the first control signal, and sets a fourth rising edge of the second clock based on the third rising edge of the second clock with a delay controlled by the second control signal.

3. The apparatus of claim 1, wherein the auxiliary frequency quadrupler comprises a phase lock loop.

4. An apparatus comprising:
a main frequency quadrupler configured to receive a first clock of a fundamental frequency and output a second clock of a quadruple frequency in accordance with a first control signal and a second control signal, wherein a first rising edge of the second clock is set in response to a rising edge of the first clock, a second rising edge of the second clock is set in response to the first rising edge of the second clock with a delay controlled by the second control signal, a third rising edge of the second clock is set in response to a falling edge of the first clock with a delay controlled by the first control signal, and a fourth rising edge of the second clock is set in response to the third rising edge of the second clock with a delay controlled by the second control signal;
an auxiliary frequency quadrupler configured to receive the first clock and output a third clock of a quadruple frequency based on a phase lock loop, wherein a static timing offset between the third clock and the second clock is controlled by a third control signal;
a calibration circuit, coupled to the auxiliary frequency quadrupler via the third clock signal, is configured to generate and output the first control signal, the second control signal, and the third control signal in accordance with a timing difference between the third clock and the second clock.

5. The apparatus of claim 4, wherein the calibration circuit adjusts the third control signal in accordance with a timing difference between the first rising edge of the second clock and a first rising edge of the third clock following the rising edge of the first clock.

6. The apparatus of claim 4, wherein the calibration circuit adjusts the second control signal in accordance with a timing difference between the second rising edge of the second clock and a second rising edge of the third clock.

7. The apparatus of claim 4, wherein the calibration circuit adjusts the first control signal in accordance with a timing difference between the third rising edge of the second clock and a third rising edge of the third clock.

8. The apparatus of claim 4, wherein the main frequency quadrupler comprises: a two-phase clock generator configured to receive the first clock and output a two-phase fourth clock in accordance with the first control signal, wherein a relative timing difference between a first phase and a second phase of the two-phase fourth clock is controlled by the first control signal; a two-phase frequency doubler configured to receive the two-phase fourth clock and output a fifth clock in accordance with the second control signal, wherein a pulse width of the fifth clock is controlled by the second control signal; and a single-phase frequency doubler configured to receive the fifth clock and output the second clock.

9. The apparatus of claim 4, wherein the auxiliary frequency quadrupler comprises a phase lock loop configured to receive the first clock and output a sixth clock, and a variable delay circuit configured to receive the sixth clock and output the third clock in accordance with the third control signal.

10. A method comprising:
receiving a first clock;
generating a first control signal, a second control signal, and a third control signal;
establishing a first rising edge of a second clock of a quadruple frequency based on a rising edge of the first clock;
establishing a second rising edge of the second clock based on the first rising edge of the second clock with a delay of an amount controlled by the second control signal;
establishing a third rising edge of the second clock based on an inversion of a falling edge of the first clock with a delay of an amount controlled by the first control signal;

establishing a fourth rising edge of the second clock based on the third rising edge of the second clock with a delay of an amount controlled by the second control signal;

generating a third clock of the quadruple frequency using a phase lock loop, wherein a static timing offset between the third clock and the second clock is controlled by the third control signal;

adjusting the third control signal in accordance with a timing difference between a first rising edge of the third clock and the first rising edge of the second clock;

adjusting the second control signal in accordance with a timing difference between a second rising edge of the third clock and the second rising edge of the second clock; and adjusting the first control signal in accordance with a timing difference between a third rising edge of the third clock and the third rising edge of the second clock.

\* \* \* \* \*